United States Patent [19]

Nahara et al.

[11] 4,286,045

[45] Aug. 25, 1981

[54] IMAGE FORMING MATERIALS AND IMAGE FORMING PROCESS

[75] Inventors: Akira Nahara; Yoshihiro Ono; Tomizo Namiki; Shigeo Harada; Yuzo Mizobuchi; Tomoaki Ikeda, all of Asaka, Japan

[73] Assignee: Fuji Photo Film Co., Ltd., Minami-ashigara, Japan

[21] Appl. No.: 94,618

[22] Filed: Nov. 15, 1979

Related U.S. Application Data

[60] Division of Ser. No. 26,713, Apr. 3, 1979, which is a continuation of Ser. No. 818,912, Jul. 25, 1977, abandoned.

[30] Foreign Application Priority Data

Jul. 28, 1976 [JP] Japan .................................. 51-90495

[51] Int. Cl.$^3$ .......................... G03F 7/02; G03C 1/00

[52] U.S. Cl. .................................... 430/270; 430/302; 430/413; 430/495; 430/496; 430/309; 430/417; 430/541; 430/292; 430/415; 430/540; 430/542

[58] Field of Search ............... 430/496, 495, 302, 309, 430/270, 413, 417, 541, 542, 292, 617, 540, 415

[56] References Cited

U.S. PATENT DOCUMENTS

| | | | |
|---|---|---|---|
| 3,660,086 | 5/1972 | Tamai et al. | 430/91 |
| 3,707,372 | 12/1972 | Hallman et al. | 430/270 |
| 3,852,067 | 12/1974 | Levy | 430/93 |
| 3,907,566 | 9/1975 | Inoue et al. | 430/495 |
| 3,966,470 | 6/1976 | Feltz et al. | 430/86 |
| 3,996,057 | 12/1976 | Kawaziri et al. | 430/353 |

FOREIGN PATENT DOCUMENTS

| | | | |
|---|---|---|---|
| 50-827 | 1/1975 | Japan | 430/495 |

*Primary Examiner*—Won H. Louie, Jr.
*Attorney, Agent, or Firm*—Sughrue, Mion, Zinn, Macpeak and Seas

[57] ABSTRACT

An image forming material comprising a support having thereon a layer composed of a Ge-S composition or a Ge-S-X composition wherein X represents at least one element selected from the group consisting of Al, Si, Mg, Ti, V, Mn, Co, Ni, Sn, Zn, Pd, In, Se, Te, Fe, I, P and O which undergoes a structural change capable of being detected optically, electrically or chemically upon exposure imagewise to light wherein the Ge-S or Ge-S-X composition layer has a thickness of at least about 300 Å and contains therein at least one element selected from the group consisting of Ag, Cu and Pb in an amount of more than 2 atoms of Ag, Cu and/or Pb based on 100 atoms of the Ge-S composition or the Ge-S-X composition.

28 Claims, No Drawings

IMAGE FORMING MATERIALS AND IMAGE FORMING PROCESS

This is a division of appplication Ser. No. 26,713, filed Apr. 3, 1979, which is in turn a continuation of Ser. No. 818,912, filed July 25, 1977, now abandoned.

BACKGROUND OF THE INVENTION

1. Field of the Invention

The present invention relates to image forming materials using a composition comprising Ge and S as main components and to image forming materials having improved stability and particularly improved moisture resistance properties.

2. Description of the Prior Art

It is already known that if chalcogen compositions or multilayer materials composed of a chalcogen composition and a metal are exposed imagewise to light, a change capable of being detected optically, electrically or chemically, occurs as a result of a structural change of the chalcogen composition in the former case or of a mutual reaction of the chalcogen composition with the metal (the so-called photodoping phenomenon) in the latter case. U.S. Pat. Nos. 3,650,743 and 3,637,379 disclose that this phenomenon can be utilized for producing image forming materials such as photographic materials for dry processings, photomasks, parts for electric circuits or lithographic printing plates, etc.

Chalcogen compositions capable of causing the above described photodoping phenomenon include chalcogen compositions containing As and particularly As-S type chalcogen compositions containing As and particularly As-S type chalcogen compositions are generally used because they have high sensitivity. However, they can not be used on an industrial scale because they are highly toxic.

Recently, however, it has been found that Ge-S type chalcogen compositions have high sensitivity and are not toxic. Thus it became possible to utilize the photodoping phenomenon on an industrial scale.

At present, many image forming materials using Ge-S compositions are known.

For example, lithographic printing plates are produced by adhering a composition comprising Ge and S and a metal or a metal compound in a physically mixed state to a base plate. They are characterized in the oil-sensitivity of these plates is enhanced by providing the above described two components on the base plate as finely divided insular particules so that a multilayer structure is not formed.

On the other hand, Japanese Patent Application No. 92391/75 (corresponding to U.S. patent application Ser. No. 709,744 filed July 29, 1976) discloses that lithographic printing plates wherein a chalcogen composition, a metal and an organic compound as essential elements are supported on a support in a state of contacting one another have high oil-sensitivity.

Further Japanese Patent Application (OPI) No. 827/75 discloses that the light sensitivity of Ge-S compositions is effectively improved by adding a metal such as Ag or Cu in a very small amount as low as 0.0001 to 1 atoms based on 100 atoms of the Ge-S composition.

However, the Ge-S type chalcogen compositions used in the prior art have a fatal defect that they are very sensitive to moisture and are easily decomposed by moisture in the air. Consequently their light sensitivity is easily deteriorated by the lapse of time.

Namely, when a Ge-S type chalcogen composition is deposited on a base plate by evaporation and is allowed to stand under a high humidity condition (for example, $GeS_2$ deposit having a thickness of 1 μm is allowed to stand for few days at 45° C. under an atmosphere of 75% relative humidity), the color of the deposited film changes from yellow to white and no structural change occurs thereafter if it is subjected to an imagewise exposure. As a result of an examination of the above-described whitened decomposition film using X-ray diffraction, $GeO_2$ is observed. Namely, it is believed that the Ge-S type chalcogen composition changes into light insensitive $GeO_2$ etc. by reacting with moisture in the air. (For example, $GeS_2+H_2O \rightarrow GeO_2+2H_2S$).

Although this low degree stability can be improved to some extent in the lighographic printing plates described in Japanese Patent Applications 33790/74 and 92391/75 above, such has not yet been sufficiently improved.

SUMMARY OF THE INVENTION

Accordingly, an object of the present invention is to provide image forming materials utilizing a chalcogenide which does not give rise to environmental pollution and is not toxic and further to provide image forming materials comprising a Ge-S composition having improved shelf life, particularly moisture stability.

Another object of the present invention is to provide an image forming process which comprises using image forming materials capable of attaining the above described object.

A further object of the present invention is to provide a planographic printing plate having an improved shelf life.

Accordingly the above objects of the present invention are achieved in one embodiment which comprises an image forming material comprising a support having thereon a layer composed of a Ge-S composition or a Ge-S-X composition, wherein X represents at least one element selected from the group consisting of Al, Si, Mg, Ti, V, Mn, Co, Ni, Sn, Zn, Pd, In, Se, Te, Fe, I, P and O, particularly preferably Al, Si, Zn, I, P and O, which undergoes a structural change capable of being detected optically, electrically or chemically on exposure imagewise to light, wherein the layer has a thickness of at least about 300 Å and contains at least one element selected from the group consisting of Ag, Cu and Pb in an amount of more than 2 atoms based on 100 atoms of the Ge-S composition or the Ge-S-X composition.

In another embodiment of this invention, this invention provides an image forming material as described above and additionally containing a metal or a metal compound in a state of externally contacting the layer of the Ge-S composition or the Ge-S-X composition wherein X is as described above.

In an even further embodiment of this invention, the invention provides an image forming material as described above and additionally containing a metal or a metal compound in a state of externally contacting the layer of the Ge-S composition or the Ge-S-X composition where X is as described above and further containing an organic compound in a state of contacting the layer of the Ge-S composition or the Ge-S-X composition and with the metal or metal compound.

DETAILED DESCRIPTION OF THE INVENTION

Examples of Ge-S compositions which can be used in the present invention are GeS, $GeS_2$, $Ge_{35}S_{65}$, $GeS_4$, $Ge_{15}S_{85}$, $GeS_{16}$ and the like.

Examples of Ge-S-X compositions are $Ge_{35}S_{60}Al_5$ (amorphous), $Ge_{35}S_{60}P_5$ (amorphous), $Ge_{35}S_{60}Si_5$ (amporphous), $Ge_{35}S_{60}Mg_5$ (amorphous+crystalline), $Ge_{35}S_{60}Ti_5$ (amorphous+$GeS_2$+$TiS_2$), $Ge_{35}S_{60}V_5$ (amorphous+$GeS_2$+$V_2S_3$), $Ge_{35}S_{60}Mn_5$ (amorphous+$Mn_2GeS_4$), $Ge_{35}S_{60}Co_5$ (amorphous+$GeS_2$), $Ge_{35}S_{60}Ni_5$ (amorphous+$GeS_2$), $Ge_{35}S_{60}Ta_5$ (amorphous+$TaS_2$), $Ge_{35}S_{60}Mo_5$ (amorphous+$MoS_2$), $Ge_{35}S_{60}W_5$ (amorphous+$WS_2$ crystalline), $Ge_{35}S_{60}Sn_5$ (amorphous+$\beta$-$SnS_2$ or $\alpha$-$SnS_2$), $Ge_{35}S_{60}Zn_5$ (amorphous+ZnS), $Ge_{20}S_{80}O_{0.2}$, $Ge_{20}S_{80}O_{20}$, $Ge_{36}S_{35}I_9$, $Ge_{35}S_{60}Al_{15}$, $Ge_{20}S_{75}Al_5$, $Ge_{30}S_{60}P_{10}$, $Ge_{20}S_{80}P_1O_2$, $Ge_{20}S_{80}P_{10}O_{20}$, $Ge_{10}S_{80}P_{10}Pd_{0.5}$ and $Ge_{10}S_{80}P_{10}Pd_5$. In the above, Ge-S compositions are more preferred than Ge-S-X compositions.

The subscripts which show the ratios of the elements in the above described compositions each means the atomic ratio of the starting materials. The sum of these subscripts sometimes exceeds 100 because of a lack of homogeneity. Further, oxygen containing compositions are those prepared by melting the oxides. The descriptions in parentheses qualitatively show the results obtained by X-ray analysis of the resulting compositions. The compositions are not always an amorphous soild, a so-called chalcogen glass, and they may contain crystalline material. In using such compositions, image forming materials of the present invention can be obtained too.

A preferred ratio of Ge and S in these compositions of Ge and S is $1>S/Ge<16$ and particularly $1>S/Ge<9$.

In the present invention, at least one element selected from Ag, Cu and Pb is incorporated in the Ge-S composition or the Ge-S-X composition in an amount of more than 2 atoms based on 100 atoms of the Ge-S or Ge-S-X composition. When Ag and/or Cu is incorporated in an amount of more than 5 atoms based on 100 atoms of the Ge-S composition or the Ge-S-X composition, the moisture stability of the chalcogen composition is markedly improved, and when Pb is incorporated in an amount of more than 10 atoms on the same basis, the moisture stability of the chalcogen composition is markedly improved. A maximum amount of Ag, Cu or Pb to be added varies depending on the sulfur content in the Ge-S composition or the Ge-S-X composition, and the amount can be increased as the sulfur content increases. Since it is believed that the metal added is generally present as a sulfide, a maximum amount of the metal added can be decided on the basis of the following formulas. Namely, in cases of Ge-S compositions, if they are represented by $GeS_\alpha$ wherein $\alpha$ is the atomic ratio of sulfur atoms to germanium atoms (e.g., in the case of $Ge_{35}S_{65}$, $\alpha=65/35=1.86$), Ag and/or Cu can be added up to about $$\frac{\alpha - 1}{\alpha + 1} \times 200$$

and Pb can be added up to about $$\frac{\alpha - 1}{\alpha + 1} \times 100.$$

In cases of Ge-S-X compositions, if they are represented by $GeS_\alpha X_\beta$ wherein $\alpha$ has the same meaning as defined above and $\beta$ is the atomic ratio of X atoms to germanium atoms, Ag and/or Cu can be added up to about $$\frac{\alpha - 1}{\alpha + \beta + 1} \times 200$$

and Pb can be added up to about $$\frac{\alpha - 1}{\alpha + \beta + 1} \times 100.$$

In cases where two elements are used as X in the Ge-S-X compositions, a maximum amount of the metal to be added can be decided according to the same principles as described above.

As described above, for example, a maximum amount of the metal to be added in cases of Ge-S compositions can be calculated as follows.

Namely, although Ag and/or Cu can be added up to 66 and Pb can be added up to 33 in the case of $GeS_2$ and Ag and/or Cu can be added up to 120 and Pb can be added up to 60 in the case of $GeS_4$, upper limits capable of effective and practical use are 80% thereof. Accordingly, Ag and/or Cu is added up to about 50 and Pb is added up to 25 in the case of $GeS_2$ and Ag and/or Cu is added up to about 100 and Pb is added up to about 50 in the case of $GeS_4$.

Particularly preferred amounts of the metals Ag and/or Cu, and Pb range from 5 to 10 atoms and 10 to 20 atoms, respectively, based on 100 atoms of the Ge-S composition or the Ge-S-X composition.

In accordance with the present invention, a Ge-S type or Ge-S-X type chalcogen composition used for a recording material can be improved in terms of changes in the properties thereof with the lapse of time, particularly moisture stability. This lack of change can be demonstrated in a simple manner analytically. For example, X-ray diffraction analysis can be used to examine whether or not $GeO_2$ precipitates after various Ge-S type or Ge-S-X type chalcogen compounds are allowed to stand at high temperature and high humidity for a long period of time. For reference, the results of such an evaluation are given in the following table. The table shows the diffraction strength of $GeO_2$ generated in a powder of a composition to be examined, which passes through a 50 mesh sieve, before and after storage at a temperature of 45° C. and a relative humidity of 75% for 10 days. This evaluation was conducted using an auto-recording type X-ray apparatus D-1 (X-ray diffraction apparatus produced by Rigaku Denki Co.), while using Co as a target and applying a voltage of 30 KV and a filament electric current of 10 mA, to measure using a scintillation counter the peak height at a diffraction angle $\theta$ of 15.1° due to reflection at the surface (101) giving the maximum diffraction strength of $GeO_2$. In the evaluation, the minimum X-ray strength which could be detected was 20 counts/sec. It can be concluded that a sample showing less than 100 counts/sec. after storage has improved moisture stability.

TABLE

| Composition | Fresh (counts/sec.) | After Storage (counts/sec.) |
|---|---|---|
| $GeO_2$ | 1200 | 1200 |
| $GeS_{1.5}$ | 0 | 240 |
| $GeS_{2.0}$ | 0 | 500 |
| $GeS_{2.5}$ | 0 | 550 |
| $GeS_{4.0}$ | 0 | 500 |
| $Ge_{27}S_{68}P_5$ | 0 | 600 |
| $Ge_{27}S_{68}O_5$ | 0 | 820 |
| $Ge_{27}S_{68}Pd_5$ | 0 | 700 |
| $Ge_{27}S_{68}I_5$ | 0 | 800 |
| $Ge_{25}S_{70}Si_5$ | 0 | 920 |
| $Ge_{31}S_{66}Zn_3$ | 0 | 820 |
| $Ge_{28}S_{72}Cu_{0.1}$ | 0 | 520 |
| $Ge_{20}S_{75}Al_5$ | 0 | 600 |
| $Ge_{28}S_{72}Ag_{0.1}$ | 0 | 480 |
| $Ge_{28}S_{71}Ag_1$ (1.01)* | 0 | 170 |
| $Ge_{27}S_{68}Ag_5$ (5.26) | 0 | 20 |
| $Ge_{27}S_{68}Cu_5$ (5.26) | 0 | 50 |
| $Ge_{27}S_{68}Pb_5$ (5.26) | 0 | 80 |
| $Ge_{30}S_{60}P_5Ag_5$ (5.26) | 0 | 80 |
| $Ge_{30}S_{60}I_5Ag_5$ (5.26) | 0 | 70 |

*The value in "( )" indicates the number of Ag, Pb or Cu atoms based on 100 atoms of the Ge-S or Ge—S—X composition.

The composition containing 5 atomic percent of oxygen in the table set forth above is uniformly amorphous where $GeO_2$ was not observed in the form of crystals. For reference, a powder of $GeO_2$ was examined and, as a result, the $GeO_2$ was found to have a peak height of 1200 counts/sec.

$Ge_{25}S_{60}Si_5$ colored white-gray after storage at 45° C. and 75% relative humidity for 10 days while fresh $Ge_{25}S_{60}Si_5$ was colored yellow. Such changes in color were remarkable in $GeS_{2.0}$, $GeS_{2.5}$, $GeS_{40}$, $GeS_{28}S_{72}Ag_{0.1}$, $Ge_{20}S_{75}Al_5$, $Ge_{31}S_{66}Zn_3$, $Ge_{28}SnCu_{0.1}$, $Ge_{27}S_{68}P_5$, $Ge_{27}S_{68}Pd_5$, $Ge_{27}S_{68}Zn_5$, etc. On the other hand, no such color change was substantially observed in $Ge_{28}S_{70}Ag_2$, $Ge_{27}S_{68}Ag_5$, $Ge_{28}S_{66}Sb_6$, $Ge_{27}S_{68}Cu_5$, $Ge_{27}S_{68}Pb_5$, $Ge_{27}S_{68}In_5$, $Ge_{27}S_{68}Sn_5$, $Ge_{30}S_{60}P_5Ag_5$, $Ge_{30}S_{60}I_5Ag_5$, etc.

There are various methods for forming the layer which contains at least one of Ag, Cu and Pb in a definite ratio in the Ge-S composition or the Ge-S-X composition on a support. Namely, a Ge-S composition or a Ge-S-X composition containing at least one of Ag, Cu and Pb in a definite ratio is previously produced and vacuum deposition is carried out with this composition using a heating process, by which the object can be attained. However, this process has a defect that the resulting composition is greatly different from the starting composition. On the other hand, samples having the same composition as that of the starting composition can be obtained by a flash evaporation process or a sputtering process. Thus, a layer of the Ge-S or Ge-S-X composition previously containing at least one of Ag, Cu and Pb having a thickness of 300 Å can be provided by depositing on the support the composition in an amount of more than 9 $\mu g/cm^2$, preferably more than 10 $\mu g/cm^2$. Further, it is preferred to produce samples containing at least one of Ag, Cu and Pb in a definite ratio by a simultaneous deposition process which comprises heating independently a Ge-S composition or a Ge-S-X composition and at least one of Ag, Cu and Pb to control the amount of each deposited independently, which is an excellent process. In the simultaneous deposition process, a layer having a thickness of more than 300 Å can be provided by depositing on the support the Ge-S or Ge-S-X composition in an amount of more than 9 $\mu g/cm^2$, preferably more than 10 $\mu g/cm^2$. The layer of the Ge-S or Ge-S-X composition containing at least one of Ag, Cu and Pb can be formed on the support by depositing the desired amount of Ag, Cu or Pb simultaneously with the Ge-S or Ge-S-X composition. The content of the Ag, Cu or Pb in the thus formed Ge-S or Ge-S-X composition layer can easily be calculated from the formation of the Ge-S or Ge-S-X composition and the amount thereof deposited and the amount of Ag, Cu or Pb deposited.

One essential embodiment of the present invention is an image forming material which is produced by depositing the above described Ge-S-composition or Ge-S-X composition containing at least one of Ag, Cu and Pb in an amount of more than 2 atoms based on 100 atoms of the Ge-S or Ge-S-X composition on a support so as to form a layer having a thickness of about 300 Å or more. When the layer has a thickness exceeding 300 Å, the layer becomes a continuous layer. In general, a continuous layer having a thickness of more than 300 Å can be formed by depositing the Ge-S or Ge-S-X composition in an amount of more than 9 $\mu g/cm^2$, preferably more than 10 $\mu g/cm^2$. The preferred upper limit of the thickness of the layer is about 10 $\mu m$, particularly preferably 500 Å to 1 $\mu m$.

Suitable supports which can be used in the present invention are glass plates and synthetic resin films such as polyester films, cellulose triacetate films, cellulose diacetate films or polycarbonate films. In uses as lithographic plates, metal plates or laminates of a metal foil and paper are preferred. Aluminum plates and zinc plates are generally used as metal plates, and it is preferred to use metal plates whose surfaces have been subjected to a graining treatment and anodic oxidation or chemical processing such as silicate processing.

Although a vacuum deposition process is excellent as a method of producing the image forming materials an electron beam deposition process, a sputtering process an ion plating process, an electrodeposition process, an electrophoresis process, a gas phase deposition process and a spraying process, etc. can also be effectively used. Examples of these techniques are described in L. I. Maissel & R. Glang *Handbook of Thin Film Technology*, McGraw Hill Inc. New York (1970).

Another preferred embodiment of the present invention is an image forming material which is produced by depositing a metal or a metal compound on a layer having a thickness of 300 Å or more and composed of a Ge-S composition or a Ge-S-X composition containing Ag, Cu and/or Pb in the above described specific amount or providing the metal or metal compound between the layer and the support.

Metals which can be used in this embodiment include Ag, Cu, Ge, Zn, Cd, Au, Pb, Al, Ga, In, Sn, V, Se, Cr, Fe, Tl, Bi, Mg, Mn, Co, Ni, Sb, Te and Pd, etc., and Ag and Cu are preferred. Suitable metal compounds which can be used include the halides of metals of Group IB, Group IVB or Group VIB, the sulfides of metals of Group IB, Group IIB, Group IVB or Group VIII and the oxides of metals of Group IV, Group V or Group VI. Particularly, halides of Ag, Cu and Pb, and sulfides of Ag, Cu, Pb and Fe are preferred. Of the metals and the metal compounds the metals are preferably used in the present invention.

Further, in this embodiment, since the metal or the metal compound does not diffuse into the layer of the Ge-S composition or the Ge-S-X composition before the exposure, it can be clearly distinguished from the Ag, Cu or Pb added to the Ge-S composition or the Ge-S-X composition layer.

In this embodiment, the metal or the metal compound may be deposited as a layer having a thickness of about 300 Å or more or may be deposited as finely divided discontinuous insular particles having of a length of about 30 Å to about 0.5μ so as to not form a layer thereof.

Although the above described deposition process may be used in a similar manner as a method of forming the metal or the metal compound, a flash deposition process or a sputtering process is excellent in using an alloy as the metal. Alternatively, it is also possible to precipitate the metal from a solution of a metal compound thereof. For example, in cases of using Ag as the metal, it is possible to deposit Ag by immersing a film of a Ge-S composition in a solution of silver nitrate. In this case, a suitable reducing agent may be added to the solution or a well known physical developing bath may be used.

A further preferred embodiment of the present invention provides an image forming material which is produced by depositing an organic compound on a product comprising a metal or metal compound deposited on a layer having a thickness of about 300 Å or more composed of a Ge-S composition or Ge-S-X composition containing at least one of Ag, Cu and Pb in the above described amount on a support so that the organic compound is in contact with both of the Ge-S composition or Ge-S-X composition and the metal or metal compound. In order to provide the three components of the Ge-S composition or of the Ge-S-X composition, the metal or the metal compound, and the organic compound in a state of contacting each other, the following methods can be used: first, both of the metal or the metal compound and the organic compound may be deposited on the layer composed of the Ge-S composition or the Ge-S-X composition as the discontinuous finely divided insular particles as above described and, secondly, one of the metal or the metal compound and the organic compound may be provided as the finely divided insular particles as above described between the layer having a thickness of about 300 Å or more composed of the other of the metal or the metal compound or the organic compound and the layer of the Ge-S composition or the Ge-S-X composition.

The above described evaporation deposition process can be used as a method of forming the organic compound to form many kinds of organic products. Further, it is also possible to deposit by immersing the layer of the Ge-S type or Ge-S-X composition containing at least one of Ag, Cu and Pd on the support in a solution which was prepared by dissolving the organic compound in a suitable solvent.

For another method for the above described embodiment, it is preferred for at least one of the metal and the metal compound and the organic compound to be formed as a homogeneously mixed state by simultaneous deposition by means of, for example, a vacuum deposition process while the amounts of each to be deposited on the layer of the Ge-S or Ge-S-X composition or between the layer and the support are controlled independently.

Suitable organic compounds used in this embodiment, include various organic compounds known in silver halide photographic chemistry. For example, antifogging agents, sensitizing agents, desensitizing agents, developing agents, dyes, pigments and photochromic compounds, etc. are suitabley used.

Examples of suitable organic compounds are shown below.

I Aldehydes and ketones (1) Aldehydes

RCHO (R = a hydrogen atom, a methyl group, an ethyl group or a phenyl group, etc.) e.g. formaldehyde, acetaldehyde, benzaldehyde;

(2) Hydroxyaldehydes

HORCHO (R = an alkyl group having 1 to 5 carbon atoms) e.g., glycolaldehyde, aldol;

(3) Halogenated aldehydes e.g., mucochloric acid, mucobromic acid;

(4) Unsaturated aldehydes e.g., acrolein, crotonaldehyde, (5) α-Diketones

RCOCOR′

(R, R′ = an alkyl group having 1 to 5 carbon atoms or a phenyl group) e.g., diacetyl, acetylbenzoyl, dibenzoyl;

(6) β-Diketones e.g., acetyl acetone, benzoylacetone, dibenzoylacetone;

(7) γ-Diketones e.g., acetonylacetone; p (8) α-Ketoaldehydes

RCOCHO (R = a methyl group, an ethyl group, a phenyl group, a p-bromophenyl group, etc.) e.g., methylglyoxal, ethylglyoxal, phenylglyoxal;

(9) Acetals $RCH(OR')_2$ (R, R′ = an alkyl group having 1 to 5 carbon atoms) e.g., diethylacetal;

(10) Hydroxyketones $RCOC(R')(R'')CH_2OH$ (R, R′, R″ = an alkyl group having 1 to 5 carbon atoms) e.g., 2,2-dimethyl-butanol-3-one;

(11) Reaction products of formaldehyde and an amine e.g., condensates of hexamethylenetetramine, formaldehyde and benzimidazole, phthalimide, etc.;

II Alkylene oxide polymers (1) $HO(R—O)_nH$ (R = ethylene, propylene, butylene, etc.; n = 10 to 10,000);

III Carboxylic acids (1) Lower unsaturated carboxylic acids e.g., maleic acid, fumaric acid, cinnamic acid;

(2) EDTA (i.e., ethylenediaminetetraacetic acid)

IV Phenols (1) Phenol and derivatives thereof

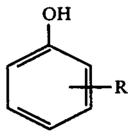

(R = a hydrogen atom, a methyl group, an ethyl group, a COOR' group (R' = a methyl group, an ethyl group, etc.) etc.) e.g., phenol, methyl-p-hydroxybenzoate;

(2) Polyhydric phenols

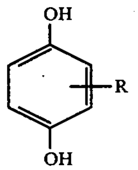

(R = a hydrogen atom, an alkyl group having 1 to 18 carbon atoms) e.g., hydroquinone, methylhydroquinone, propylhydroquinone, 2,5-di(1,1-dimethylbutyl)-hydroquinone;

V Amines and hydrazines (1) Aliphatic amines $NH_2(RNH)_nRNH_2$ (R = an alkylene chain having 1 to 6 carbon atoms; n = 1–3) e.g., 3-azatetramethylenediamine;

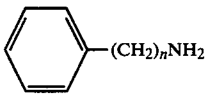

(n = 1 to 20) e.g., β-phenylethylamine, γ-phenylpropylamine;

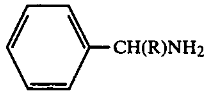

(R = an alkyl group having 1 to 5 carbon atoms) e.g., 1-phenylpropylamine, 1-phenylbutylamine;

(2) Aromatic amines, e.g., those compounds containing two or more amino groups on one benzene ring, for example, benzidine, chloramine, Metol;

(3) Hydrazine

VI Those compounds containing a —CO—NH— group e.g., phthalimide, saccharin, salicylamide, acetylated compounds of aminophenol;

VII Sulfur containing organic compounds

Organic compounds having at least one of an —SH group, a >C=S group, an $—(S)_n—$ group wherein n = 1 to 6, an $—SO_2H$ group or an $—SO_3H$ group, can be used in this invention.

(1) Thioureas represented by the following formula:

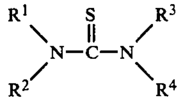

($R^1$-$R^4$ = a hydrogen atom, an alkyl group or hydroxyalkyl group having 1 to 5 carbon atoms, a phenyl group etc.; wherein $R^1$ and $R^2$ or $R^3$ and $R^4$ may be bonded to form a 5-membered heterocyclic ring such as pyrrolidine) e.g., thiourea, ethylenethiourea, trimethylthiourea, N,N'-dimethylolthiourea;

(2) Thiosemicarbazides and thiocarbazides represented by the following formulae:

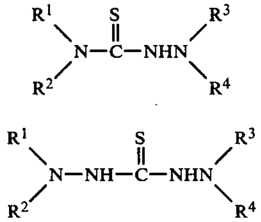

($R^1$-$R^4$ = a hydrogen atom, an alkyl group having 1 to 5 carbon atoms, a phenyl group etc.) and derivatives thereof, e.g., thiosemicarbazide, 4-phenylthiosemicarbazide, dithizone, thiocarbazide;

(3) Sulfides or polysulfides represented by the following formula:

$R^1—(S)_n—R^2$ ($R^1$, $R^2$ = an alkyl group having 1 to 30 carbon atoms, a phenyl group, a naphthyl group, etc.; wherein such groups may be substituted with a carboxyl group, a nitro group, an $—NH_2$ group, a formylalkylamino group having 1 to 3 carbon atoms, etc.; n = 1 to 6) e.g., 4,4'-thiodibenzoic acid, diformylmethyldisulfide;

(4) Sulfinic acids or sulfonic acids represented by the following formulae:

$R—SO_2H$ $R—SO_3H$ (R = an alkyl group having 1 to 5 carbon atoms, a phenyl group, etc.) e.g., benzenesulfinic acid, benzenesulfonic acid, 2-butanesulfinic acid;

(5) Dithiocarbamic acids represented by the following formula:

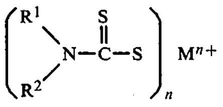

($R^1$, $R^2$ = a hydrogen atom, an alkyl group having 1 to 5 carbon atoms, an aralkyl group having 7 to 9 carbon atoms, a phenyl group, etc.; M = a hydrogen atom, an n valent metal ion; n = 1 to 2) e.g., sodium diethyl dithiocarbamate, silver diethyl dithiocarbamate, zincdibenzyl dithiocarbamate;

(6) Thiobenzophenones represented by the following formula:

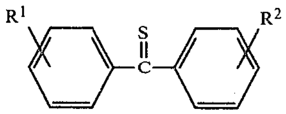

($R^1$, $R^2$ = a hydrogen atom, an alkyl group having 1 to 5 carbon atoms, an alkoxy group having 1 to 5 carbon atoms, an amino group substituted with two alkyl groups which may each have 1 to 5 carbon atoms, Cl, Br, I) e.g., N,N,N′,N′-tetramethyl-4,4′-diaminothiobenzophenone (thio Michler's ketone);

(7) 5-Membered rings or derivatives thereof having a sulfur atom as one member of the ring;

(a) Dithiolan (b) Thiazole or benzothiazole; which can be substituted with an alkyl group having 1 to 5 carbon atoms; an acetylthioacetamido group, an $-NH_2$ group and/or an —SH group, if desired; e.g., 1,3-thiazole, benzothiazole, 2-aminobenzothiazole, 2-[α-(acetylthio)acetamido]-benzothiazole, 2-mercaptobenzothiazole, 2-mercapto-6-methylbenzothiazole;

(c) Thiazoline, rhodanine, isorhodanine;

(d) Thiazolidine, 4-carboxy-thiazolidine;

(e) Thiadiazole, 2,5-dimercapto-1,3,4-thiadiazole, potassium-5-sulfide-2-thioxo-1,3,4-thiadiazoline; These sulfur containing 5-membered ring compounds may be unsubstituted or substituted. Of these, mercapto or thioether-substituted compounds are particularly preferred.

(8) The following compounds substituted with an —SH group, an =S group or an —S—R group wherein R represents an alkyl or alkenyl group having up to 20 carbon atoms, a phenyl group and the like;

(a) Pyrrole and benzopyrrole; which can be substituted with an alkyl group having 1 to 20 carbon atoms, a phenyl gorup, and/or an alkylcarbonyl group having 2 to 5 carbon atoms, if desired; e.g., 2-mercaptopyrrole, N-mercapto-2-acetylbenzopyrrole;

(b) Imidazole and benzimidazole; which can be substituted with an alkyl group having 1 to 20 carbon atoms, an alkylamido group having 2 to 21 carbon atoms, and/or a phenyl group, if desired; e.g., 2-mercaptoimidazole, 2-mercaptobenzimidazole, 5-lauroamido-2-mercaptobenzimidazole, 2-undecyl-3-phenyl-4-mercaptoimidazole, 1-phenyl-2-mercaptoimidazole;

(c) Imidazoline
e.g., 2 mercaptoimidazoline, 2-hexyldecylthioimidazoline hydrogen bromide salt;

(d) Pyrazole and pyrazolidine; which can be substituted with one or more carboxyl groups and/or benzoyl groups, if desired; e.g., 1-mercaptopyrazole, 1-mercaptopyrazole-3,5-dicarboxylic acid, 1-benzoyl-3-mercaptopyrazolidine, 1,2-benzoylpyrazolidine-3-thione;

(e) Triazole and benzotriazole; which can be substituted with one or two alkyl groups having 1 to 20 carbon atoms, a phenyl group and/or a phenyl group substituted with an alkylamido group having 2 to 20 carbon atoms, if desired; e.g., 2-mercapto-1,2,4-triazole, N-mercaptobenzotriazole, 3,4-dimethyl-5-mercapto-1,2,4-triazole, 3-methyl-4-phenyl-5-mercaptotriazole, 3-mercapto-4-phenyl-1,2,4-triazole, 3-p-caproamidophenyl-4-ethyl-5-mercapto-1,2,4-triazole, 3-n-undecyl-4-phenyl-5-mercapto-1,2,4-triazole; Moreover, 1,5-dimercapto-3,7-diphenyl-[1,2,4]triazole-[1,2,a][1,2,4]triazole can be used.

(f) Tetrazole; which can be substituted with one or two alkyl groups having 1 to 5 carbon atoms, a phenyl group, a phenyl group substituted with a benzamido group and/or an alkylamido group having 2 to 21 carbon atoms, if desired; e.g., 5-mercaptotetrazole, 1-phenyl-5-mercaptotetrazole, 1-(m-caproamidophenyl)-5-mercaptotetrazole, 1-(m-lauroamidophenyl)-5-mercaptotetrazole, 1-(m-benzamidophenyl)-5-mercaptotetrazole;

(g) Oxazole and benzoxazole; which can be substituted with one or two alkyl groups having 1 to 5 carbon atoms, or phenyl groups, if desired; e.g., 2-mercaptobenzoxazole;

(h) Pyridine; which can be substituted with one or two carboxyl groups, or sulfo groups; e.g., N-mercaptopyridine-2,3-dicarboxylic acid, N-mercaptopyridine-2-sulfonic acid;

(i) Quinoline, isoquinoline and 5,8-dioxyquinoline; which can be substituted with one or two carboxyl groups, if desired; e.g., 2-mercaptoquinoline, 2-mercaptoisoquinoline, 3-mercaptoquinoline-2,3-dicarboxylic acid, 2-mercapto-5,8-dioxyquinoline;

(j) Pyrimidine; which can be substituted with one or more alkyl groups having 1 to 5 carbon atoms, or an oxo group, if desired; e.g., 2-mercaptopyrimidine, 2-mercapto-4-methyl-t-oxopyrimidine, thiobarbituric acid, 2-ethylthio-4-methyl-6-oxopyrimidine;

(k) Morpholine; which can be substituted with a benzoyl group, if desired; e.g., 2-mercaptomorpholine, 2-mercapto-N-benzoylmorpholine;

(l) Purine and caffeine; e.g., 2-mercaptopurine, 2-mercaptocaffeine;

(m) Tetrazaindene; which can be substituted with an alkyl group having 1 to 3 carbon atoms, or a hydroxyl group; e.g., 2-mercapto-4-hydroxy-6-methyl-1,3,3a,7-tetrazaindene;

Compounds (a) to (m) above without substituents such as an —SH group, an =S group, an —S—R group wherein R has the same meaning as above can still be used as the organic compound of the present invention.

VIII Selenic acids $R-SeO_2H$ (R = an alkyl group having 1 to 5 carbon atoms, or a phenyl group) e.g., ethylselenic acid, benzeneselenic acid;

IX Effective dyes and pigments (The CI number indicates the identification number in the *Color Index,* 3rd Ed., The Society of Dyers and Colorists, Bradford, Yorkshire (1971).)

(1) Azo dyes (those containing an —N=N—group)

(a) Acid dyes;

e.g., 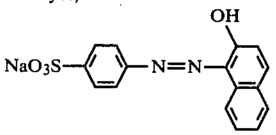

Orange II (CI 15510)

(b) Acid mordant dyes;

e.g., 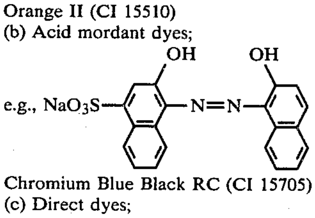

Chromium Blue Black RC (CI 15705)

(c) Direct dyes;

e.g.,

-continued

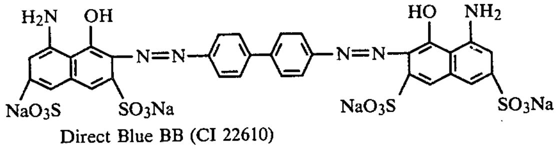

Direct Blue BB (CI 22610)

(d) Metal complex salt dyes;

e.g.,

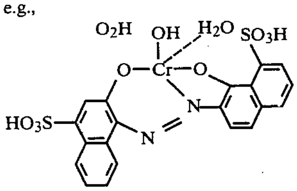

Palatine Fast Blue GGN (CI 14880)

(e) Basic dyes;

e.g.,

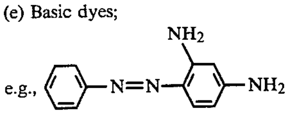

Chrysoidine (CI 11270)

(f) Acetate dyes;

e.g.,

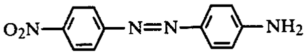

(g) Azoic dyes;

(i) Fast color bases;

e.g.,

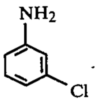

Fast Orange G Base (CI 37005)

(ii) Fast color salts;

e.g.,

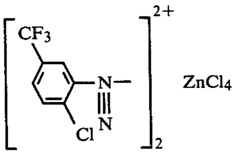

Fast Orange Salt RD (CI 37050)

(iii) Naphthols;

e.g.,

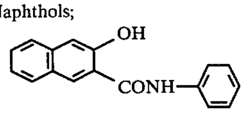

Naphthol AS (CI 37505)

(iv) Rapid fast dyes;

e.g.,

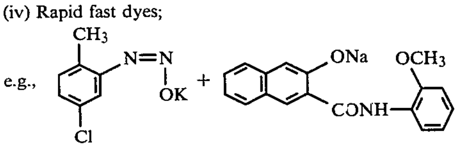

Rapid Fast Scarlet RH (CI 469)

(v) Rapidogen dyes:

e.g.,

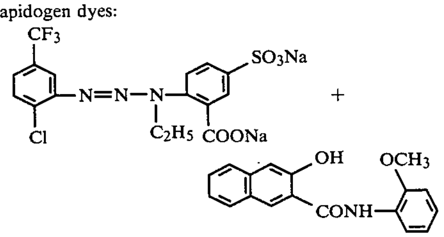

(h) Pyrazolone dyes (those containing

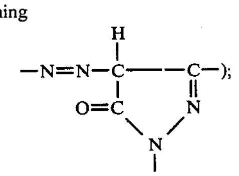

-continued e.g.,

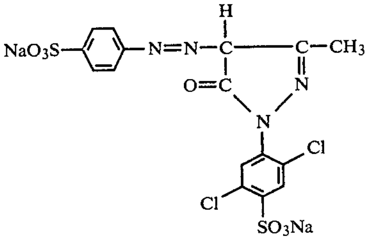

Xylene Fast Yellow 2 G (CI 18965)

(i) Stilbene dyes (those containing

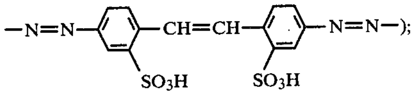

e.g.,

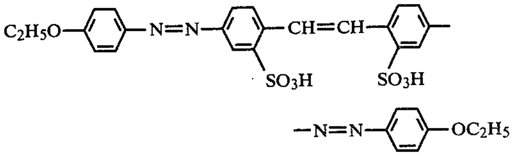

Chrysophenine G (CI 24895)

(j) Thiazole dyes (those containing

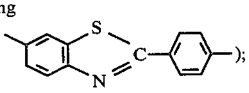

e.g.,

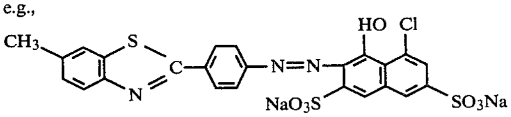

Diaminrosa BD (CI 15075)

(2) Anthraquinone dyes (those containing

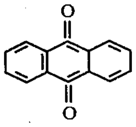

);

(a) Mordant dyes;

e.g.,

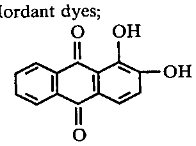

Alizarin (CI 58000)

(b) Acid mordant dyes;

e.g.,

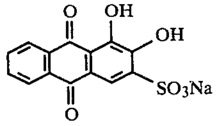

Alizarin Red S (CI 58005)

(c) Acid dyes;

e.g.,

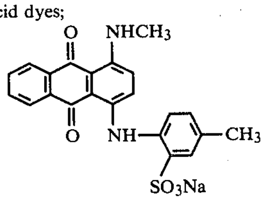

Alizarin Astral B (CI 61530)

(d) Acetate dyes;

e.g.,

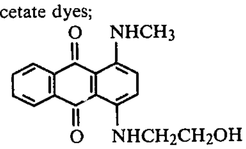

Celliton Fast Blue FER (CI 61505)

(e) Vat dyeing dyes;

(i) Anthraquinone type dyes;

-continued e.g.,

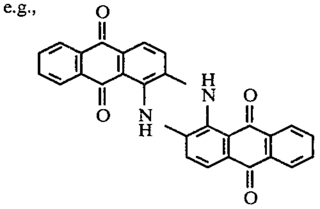

Indanthrene Blue RSN (CI 69800)
(ii) Anthrone type dyes;
e.g.,

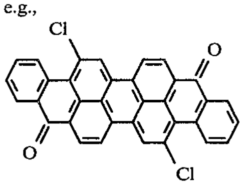

(CI 60010)

(3) Indigoid dyes (those containing —CO—C=C—CO—);

(a) Indigoids;

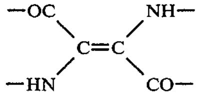

for example,

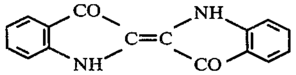

Indigo (CI 73000)
(b) Thioindigoids;

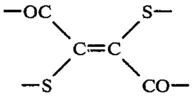

for example,

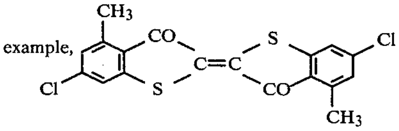

(CI 73385)

(4) Soluble vat dyeing dyes
(a) Indigoids;
e.g.,

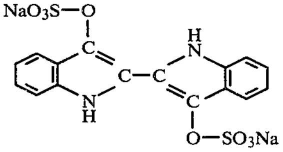

Indigodol O (CI 73002)
(b) Anthraquinoids;
e.g.,

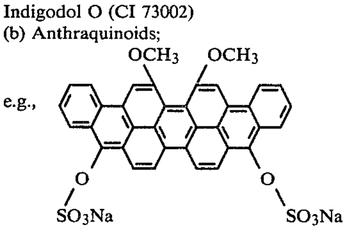

Anthrasol Green IB (CI 59826)

(5) Sulfur dyes;
e.g.,

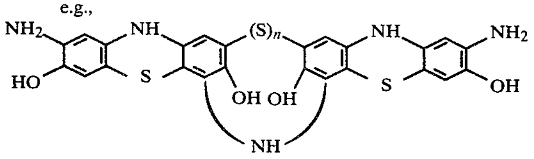

(CI 53185) n: 2-3

(6) Carbonium dyes (those containing —C—);

(a) Diphenylmethane dyes (those containing

-continued

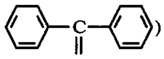)

e.g.,

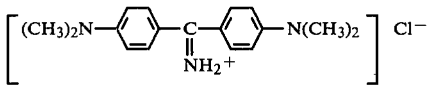

Auramine
(b) Triphenylmethane dyes (those containing

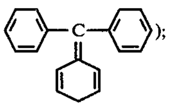);

e.g., 1.

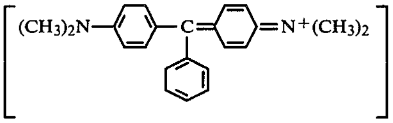

Oxalic acid salt
Malachite Green (CI 42000)

2.

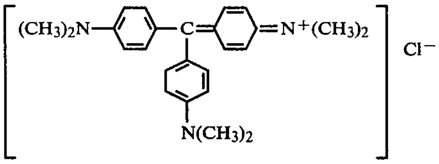

Crystal Violet (CI 42555)

(c) Xanthene dyes (those containing

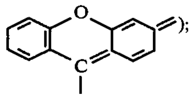);

e.g.,

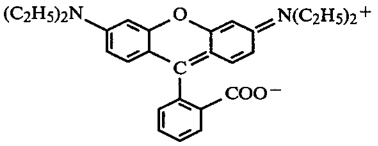

Rhodamine B (CI 45170)

(d) Acridine dyes (those containing

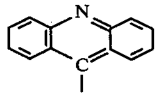);

e.g.,

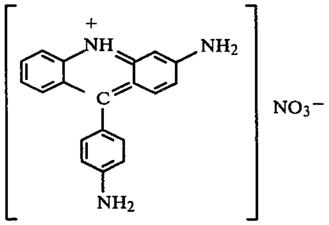

Rhosphine (CI 46045)

(7) Quinoeimine dyes (those containing >C=N—group)

(a) Azine dyes (those containing

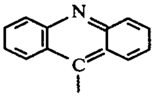);

e.g.,

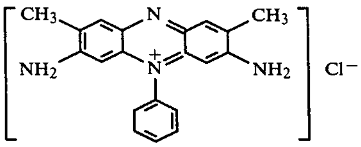

Safranine T (CI 50240)

-continued (b) Oxazine dyes (those containing 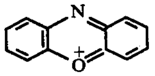 );

e.g., 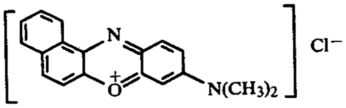

Meldora's Blue (CI 51175)

(c) Thiazine dyes (those containing 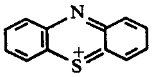 );

e.g., 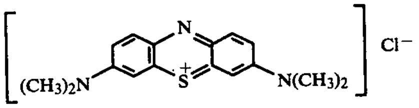

(CI 52015)

(8) Phthalocyanine dyes

Those containing 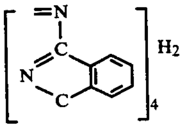

(9) Other dyes (a) Cyanine dyes (those containing

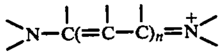 );

(b) Quinoline dyes;

e.g., 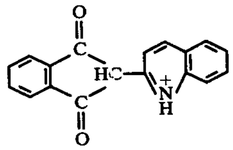

Quinoline Yellow (CI 47000)

(c) Nitro dyes;

e.g., 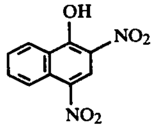

Naphthol Yellow S (d) Nitroso dyes;

e.g., 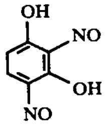

Fast Green O

X Spiropyran compounds (1) 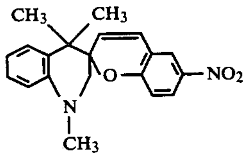

1,3,3-trimethyl-6'-nitro-spiro(indoline-2,2'-benzo-α-pyran)

(2) 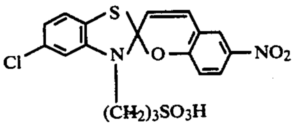

3-(3-sulfopropyl)-5-chloro-6'-nitrospiro-(benzothiazoline-2,2'-benzo-α-pyran)

-continued (3) 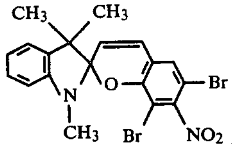

1,3,3-trimethyl-6',8'-dibromo-7'-nitrospiro-(indoline-2,2'-benzo-α-pyran)

(4) 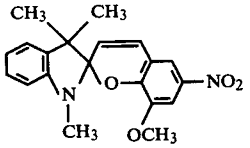

1,3,3-trimethyl-6'-nitro-8'-methoxyspiro-(indoline-2,2'-benzo-α-pyran)

(5) 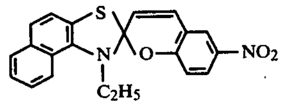

3-ethyl-6'-nitrospiro(benzothiazoline-2,2'-benzo-α-pyran)

(6) 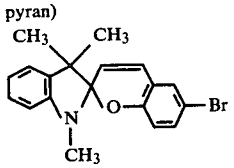

1,3,3-trimethyl-6'-bromospiro(indoline-2,2'-benzo-α-pyran)

(7) 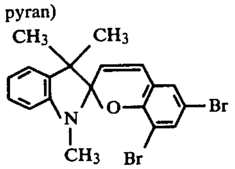

1,3,3-trimethyl-6',8'-dibromospiro(indoline-2,2'-benzo-α-pyran)

(8) 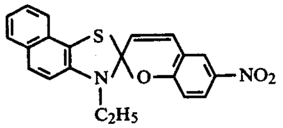

3-ethyl-6'-nitrospiro(naphtho[2,1,d]thiazoline-2,2'-benzo-α-pyran)

(9) 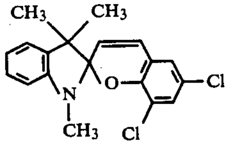

1,3,3-trimethyl-6',8'-dichlorospiro(indoline-2,2'-benzo-α-pyran)

(10) 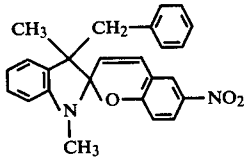

1,3-dimethyl-3-benzyl-6'-nitrospiro(indoline-2,2'-benzo-α-pyran)

(11) 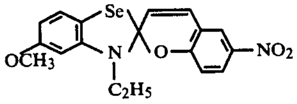

3-ethyl-5-methoxy-6'-nitrospiro(benzoselenazoline-2,2'-benzo-α-pyran)

-continued (12)

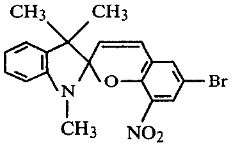

1,3,3-trimethyl-6'-bromo-8'-nitrospiro(indoline-2,2'-benzo-α-pyran)

(13)

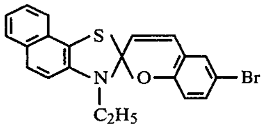

3-ethyl-6'-bromospiro(naphtho[2,1,d]thiazoline-2,2'-benzo-α-pyran)

(14)

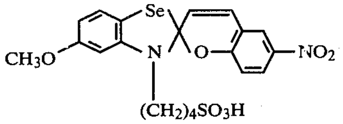

3-(4-sulfobutyl)-5-methoxy-6'-nitrospiro-(benzoselenazoline-2,2'-benzo-α-pyran)

(15)

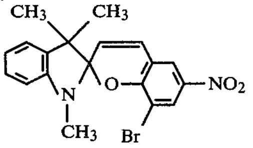

1,3,3-trimethyl-6'-nitro-8'bromospiro(indoline-2,2'-benzo-α-pyran)

(16)

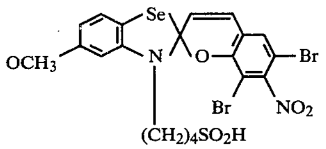

3-(4-sulfobutyl)-5-methoxy-6',8'-dibromo-7'-nitrospiro(benzoselenazoline-2,2'-benzo-α-pyran)

(17)

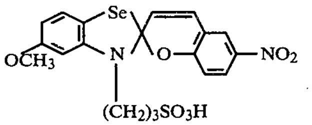

3-(3-sulfopropyl)-5-methoxy-6'-nitrospiro-(benzoselenazoline-2,2'-benzo-α-pyran)

(18)

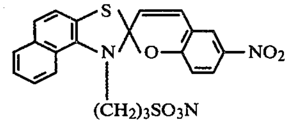

3-(3-sulfopropyl)-6'-nitrospiro(naphtho[1,2,d]-thiazoline-2,2-benzo-α-pyran)

(19)

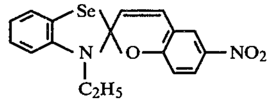

3-ethyl-6-'-nitrospiro(benzoselenazoline-2,2'-benzo-α-pyran)

Of the organic compounds described above, sulfur containing organic compounds VII, dyes or pigments IX and spiropyran compounds X are preferred. In particular, sulfur containing organic compounds VII having an —SH group, a C═S group, more particularly, compounds (1), (2), (5), (6), (7)(a), (7)(b), (7)(c), (7)(d), (7)(e), (8)(b), (8)(c), (8)(e), (8)(f), (8)(j), and (8)(m) of VII and Methylene Blue, Crystal Violet and Rhodamine B of IX are preferably employed.

Although the reason why the moisture resistance property is improved by adding at least one of Ag, Cu and Pb to the Ge-S compositions or Ge-S-X compositions in an amount above the specific ratio set forth above is not at present understood, and while not desiring to be bound, such is believed to be as follows. The Ge-S composition or the Ge-S-X composition generally has many lattice defects in its bonding states and, consequently, it contains many dangling bond states. It is believed that moisture in the air reacts with the Ge-S composition through these bonds. Further it is believed that, by addition of at least one of Ag, Cu and Pb, dangling bonds link stably to Ag, Cu or Pb and, consequently, the composition is stablized and is not affected by moisture in the air.

In order to determine the amount effective for Ge-S or Ge-S-X compositions, a sample which was formed by vacuum deposition of $GeS_{2.0}$ in the amount of 30 $\mu g/cm^2$ (thickness 1000 Å) on a polyethylene terephthalate support having a thickness of 100μ and samples formed by simultaneous deposition which contained homogeneously 0.5 $\mu g/cm^2$, 1.0 $\mu g/cm^2$, 1.5 $\mu g/cm^2$ and 2.0 $\mu g/cm^2$ of Ag in 30 $\mu g/cm^2$ of $GeS_{2.0}$ (0.7, 1.4, 2.1 and 2.8 atoms of Ag based on 100 atoms of $GeS_2$, respectively) were allowed to stand at 45° C. under a relative humidity of 75% for 3 days. As a result, the film of the sample which did not contain Ag changed from yellow to white and the sample containing 0.5 $\mu g/cm^2$ of Ag whitened to a fair extent, and images having a contrast could not be obtained by imagewise exposure to light.

On the other hand, in samples containing 1.5 $\mu g/cm^2$ or more of Ag, the films did not undergo any change and had a yellow color and images having a good contrast were obtained by imagewise exposure to light. Similar examinations were carried out in cases of the simultaneous deposition of $GeS_2$ and Cu, the simultaneous deposition of $GeS_2$ and Pb, the simultaneous deposition of $GeS_2$, Ag and Pb, the simultaneous deposition of $GeS_2$, Cu and Pb and the simultaneous deposition of $GeS_2$, Cu and Au. It was found that the moisture resistance property in these cases did not deteriorate if the amount of at least one of Ag, Cu and Pb was more than 2 atoms based on 100 atoms of the Ge-S type composition.

Further, a sample comprising 30 $\mu g/cm^2$ of $GeS_{2.0}$ (thickness: 1000 Å) formed by vacuum deposition on a polyethylene terephthalate support having a thickness of 1000μ and samples produced by simultaneous deposition which contained homogeneously 0.5 $\mu g/cm^2$, 1.0 $\mu g/cm^2$, 1.5 $\mu g/cm^2$, 2.0 $\mu g/cm^2$ and 5.0 $\mu g/cm^2$ of Ag in 30 $\mu g/cm^2$ of $GeS_{2.0}$ (0.7, 1.4, 2.1, 2.8 and 7.0 atoms of Ag based on 100 atoms of $GeS_2$, respectively) were prepared. Then 6 $\mu g/cm^2$ of Ag and 1 $\mu g/cm^2$ of 1-phenyl-5-mercaptotetrazole were deposited on the layer of each sample by vacuum deposition. As a result of allowing these samples to stand at 45° C. in an atmosphere of a relative humidity of 75% for 10 days, images having a contrast could not be obtained by imagewise exposure in a sample which did not contain Ag.

Further, images having a distinct contrast could not be obtained in samples having an Ag content of 0.5 to 1.0 $\mu g/cm^2$. However, in the samples having an Ag content of 1.5 $\mu g/cm^2$, 2.0 $\mu g/cm^2$ and 5.0 $\mu g/cm^2$, images having a distinct contrast could be obtained. Similar examinations were carried out for Cu and Pb. Further, addition of two metals of Ag and Cu was examined also. As the result of such examinations, it was found that the moisture resistance property did not deteriorate when the amount of at least one of Ag, Cu and Pb was more than 2 atoms based on 100 atoms of the Ge-S composition.

It will be understood from the above description that the minimum value of the amount of Ag, Cu or Pb added to the Ge-S composition or the Ge-S-X composition is critical.

The image forming materials of the present invention are light-sensitive, and can be used to form visible images simply by imagewise exposure to light (without additional) processings). That is, the image forming material having the Ge-S or Ge-S-X composition on the support is exposed to light thereby to increase the optical density at the exposed areas, and, as a consequence, providing visible images.

The image forming materials having further the metal or metal compounds deposited on the Ge-S or Ge-S-X composition layer are exposed to light whereby photo-doping phenomenon occurs at the exposed areas at which the metallic gloss disappears to form visible images.

The image forming materials of the present invention can be used for a planographic printing plate by merely imagewise exposure to light utilizing the difference in hydrophilicity and hydrophobicity of the image and nonimage areas thereof. That is, when the image forming material is exposed to light, the exposed areas become hydrophilic or hydrophobic different from the non-exposed areas. Because of the difference, when a conventional printing ink is applied to the material exposed to light, the ink is selectively adhered only to the exposed areas or to the non-exposed areas, then is transferred to a paper to obtain a print. As a matter of course, water is preferably applied prior to the application of the ink. Of the image forming materials of the present invention, the image forming material comprising a support having the Ge-S or Ge-S-X composition containing at least one of Ag, Cu and Pb, the metal or metal compound and the organic compound is particularly preferred for a planographic printing plate.

The image forming materials of the present invention can be processed with acid or alkali solutions after exposure to fix the image.

Further, it is possible to obtain images having a high contrast by processing such a physical developing solution utilizing a difference in the surface activity between the non-exposed areas and the exposed areas.

Any physical developing solution which can be used in silver salt photography may be used in this invention. A suitable temperature for processing is about 15° to about 35° C. and a suitable period of time for processing is about 10 seconds to about 10 minutes, by which images having good contrast are obtained.

An example of a physical developing solution which is particularly effective in the present invention is shown in the following.

| | |
|---|---|
| Solution A | |
| Metol | 2.1 g |
| Acetic Acid | 10 cc |
| Citric Acid | 2.1 g |
| Gelatin | 1.7 g |
| Water | 250 cc |
| Solution B | |
| Silver Nitrate | 10 g |
| Water | 45 cc |

Solution A and Solution B are mixed in a volume ratio of 1:1 just before use.

Suitable light sources which can be used for exposure in the above process, include mercury lamps, tungsten lamps, sunlight, xenon lamps, flash lamps, carbon arc lamps, electron beams, laser beams (He-Cd), Ar, Kr, He-Ne, etc.) and the like, with a mercury lamp of 100 W to 10 KW being most conveniently used.

The irradiation time can vary widely depending upon the intensity of the light source, the wavelength, the distance from the light source, the thickness of the layers, etc., but about 1 sec to about 60 min, particularly about 20 sec to about 10 min, is generally sufficient.

Further, the image recording materials have many uses utilizing structural changes capable of being detected optically, electrically or chemically caused by imagewise exposure. As described in detail above, the moisture resistance property of the image recording materials is remarkably increased in the present invention which comprises adding at least one of Ag, Cu and Pb to the Ge-S or Ge-S-X composition in an amount above a specific value, by which the recording materials can be practically used for many uses. Accordingly, the effect of the present invention is very important.

Although all of the image forming materials of the present invention have good stability with the lapse of time, those to which the metal or the metal compound is adhered have an excellent oil-receptivity property and those which contain further the organic compound have a superior oil-receptivity property.

The present invention will be illustrated in greater detail by reference to the following examples. Unless otherwise indicated herein, all parts, percents, ratios and the like are by weight.

EXAMPLE 1

150 mg of a composition composed of $GeS_{2.0}$ (the subscript indicates the atomic ratio), which was produced by melting germanium and sulfur each having a purity of 99.999% under vacuum and cooling rapidly was put in an alumina coated tungsten basket placed in a vacuum deposition apparatus as an evaporation source. At the same time 100 mg of silver having a purity of 99.99% was put in a molybdenum boat. After a polyethylene terephthalate support having a thickness of 100μ was placed in the vacuum deposition apparatus at a distance of about 30 cm from the evaporation sources, deposition was carried out by operating the apparatus at a vacuum of $5\times10^{-5}$ without changing the rate of deposition rates so as to uniformly disperse Ag in $GeS_2$ until the amount of $GeS_2$ deposited became 15 $\mu g/cm^2$ and that of the Ag deposited became 3.0 $\mu g/cm^2$ to produce a sample containing about 4.2 atoms of Ag based on 100 atoms of $GeS_2$. The above described deposition amounts were measured using a monitor (DTM-200 type monitor, produced by Sloan Co. in U.S.A.) in the vacuum deposition apparatus.

On the deposition surface of this sample, a positive type exposure mask was superposed and the sample was exposed to light for 3 minutes using as an exposure device PS Light ((output 2 KW) produced by the Fuji Photo Film Co., hereinafter "PS-light") by which a positive type image having a contrast of an optical density difference of 0.2 was obtained.

In a case of a sample where Ag was not added, light sensitivity was lost after 2 days at 45° C. under a relative humidity of 75%. On the contrary, in the sample produced in the present example, the light sensitivity was not lost even though it was allowed to stand at the above-described temperature in the above described humidity for 7 days.

EXAMPLE 2

The positive image obtained in Example 1 was processed for 1 minute in the following physical developing solution, by which Ag precipitated on the nonexposed area to obtain a good positive image having a contrast of an optical density difference of 1.0. After the positive image was allowed to stand at 45° C. under a relative humidity of 75% for 7 days, a good positive image was obtained using the same physical development.

| | |
|---|---|
| Solution A | |
| Metol | 2.1 g |
| Acetic Acid | 10 cc |
| Citric Acid | 2.1 g |
| Gelatin | 1.7 g |
| Water | 250 cc |
| Solution B | |
| Silver Nitrate | 10 g |
| Water | 45 cc |

Solution A and Solution B were mixed in a volume ratio of 1:1 prior to use for physical development.

EXAMPLE 3

$Ge_{30}S_{65}P_5$ and Cu were homogeneously deposited by simultaneous deposition in the same manner as in Example 1 in amounts of 36 $\mu g/cm^2$ of $Ge_{30}S_{65}P_5$ and 6.0 $\mu g/cm^2$ of Cu to a sample containing about 11.4 atoms of Cu based on 100 atoms of $Ge_{30}S_{65}P_5$.

Ag was then deposited thereon in an amount of 10.0 $\mu g/cm^2$ to obtain a multilayer structure. By exposure to light for 5 minutes using a PS-light, a positive image having a high contrast was obtained.

In the case of producing a sample wherein Ag was not added to the $Ge_{30}S_{60}P_5$ deposition layer, the light sensitivity was lost after 7 days at 45° C. under a relative humidity of 75%. On the contrary, in the sample produced by this example, the light sensitivity was not lost even though the sample was allowed to stand under the above described temperature and humidity conditions for 14 days. Accordingly, a practical and excellent image recording material was obtained.

EXAMPLE 4

$GeS_{2.5}$ and Pb were homogeneously deposited by simultaneous deposition in the same manner as in Example 1 in amounts of 36 $\mu g/cm^2$ of $GeS_{2.5}$ and 6.0 $\mu g/cm^2$ of Pb to form a sample containing about 3.1 atoms of Pb based on 100 atoms of $GeS_{2.5}$.

Ag was then deposited thereon in an amount of 10.0 $\mu g/cm^2$ to obtain a multilayer structure. This sample was exposed to light for 3 minutes using a PS-light, by which a positive image having a high contrast was obtained.

In the case of producing a sample wherein Ag was not added to the $GeS_{2.5}$ deposition layer, the light sensitivity was lost after 2 days at 45° C. under a relative humidity of 75%. On the contrary, in the sample produced in this example, the light sensitivity was not lost even though it was allowed to stand under the above described humidity and temperature conditions for 7 days.

EXAMPLE 5

$GeS_{2.5}$ and Ag were uniformly deposited by simultaneous deposition in the same manner as in Example 1 in amounts of 30 $\mu g/cm^2$ of $GeS_{2.5}$ and 5.0 $\mu g/cm^2$ of Ag to form a sample containing about 6.0 atoms of Ag based on 100 atoms of $GeS_{2.5}$. Ag was then deposited thereon in the amount of 1.0 $\mu g/cm^2$. This sample was exposed to light for 1 minute using a PS-light to obtain a positive image having a slightly low contrast. The sample then processed for 1 minute in a physical developing solution as described in Example 2, by which Ag precipitated on the nonexposed area to obtain a good positive image having a contrast of an optical density difference of 1.3.

In the case of producing a sample wherein Ag was not added to the $GeS_{2.5}$ deposition layer, although a positive image was obtained in a similar manner, the light sensitivity was lost after 2 days at 45° C. under a relative humidity of 75% and Ag could not be precipitated by physical development. On the other hand, in the sample of this invention produced in this example, physical development was carried out to produce a good positive image, even though the sample was stored under the same temperature and humidity conditions for 2 days.

EXAMPLE 6

2 g of a composition composed of $Ge_{27}S_{68}Ag_5$ which was produced by melting Ge, S and Ag each having a purity of 99.999% under a vacuum and cooling rapidly was put in a sample case of an electron beam evaporation device placed in a vacuum deposition apparatus. After a polyethylene terephthalate support having a thickness of 100μ was placed at a distance of about 30 cm from the evaporation source, deposition was carried out by applying electron beams of 700 $W/cm^3$ for 30 seconds to the evaporation source under a vacuum of $1\times10^{-5}$ Torr to produce a sample. By exposure to light for 3 minutes using a PS-light, a positive image having a contrast of an optical density of 0.3 was obtained. The light sensitivity was not lost even though the sample allowed to stand at 45° C. under a relative humidity of 75% for 7 days. Further, a good positive image was also obtained by carrying out physical development as described in Example 2.

EXAMPLE 7

After an aluminum plate of a size 250 mm×460 mm which had been subjected to graining and anodic oxidation was placed in the form of an arc in a vacuum deposition apparatus at a distance of about 30 cm from the evaporation sources, $GeS_{2.5}$ and Ag were uniformly deposited by simultaneous deposition in the same manner as in Example 1 in amounts of 15 $\mu g/cm^2$ of $GeS_{2.5}$ and 3 $\mu g/cm^2$ of Ag to form a sample containing about 8.1 atoms of Ag based on 100 atoms of $GeS_{2.5}$.

Ag was then deposited thereon in an amount of 60 $\mu g/cm^2$ to obtain a multilayer structure. By exposure to light for 2 minutes using a PS-light, a positive image having a high contrast was obtained. This sample was then put on "Hamadastar-600CD" lithographic printing machine without any processing of the sample. After dampening with water which is generally carried out in lithography, an ink was put thereon, by which a negatively inked lithographic printing plate was obtained by which 2000 sheets of paper could be printed.

In the case of producing a sample wherein Ag was not added to the $GeS_{2.5}$, when the sample was allowed to stand at 45° C. under a relative humidity of 75% for 6 hours, all the surface was inked and the sample could not be used as a printing plate. On the other hand, in the sample of the present invention produced in this example, printing could be suitably carried out even though the sample had been subjected to the same processings.

EXAMPLE 8

150 mg of a composition of $GeS_{2.0}$ which was produced by melting germanium (Ge) and sulfur (S) each having a purity of 99.999% in a vacuum and cooling rapidly was put in an alumina coated tungsten basket placed in a vacuum deposition apparatus as an evaporation source. At the same time, 200 mg of Ag having a purity of 99.99% was put in a molybdenum boat.

After a polyethylene terephthalate support having a thickness of 100μ was placed in the vacuum deposition apparatus at a distance of about 30 cm from the evaporation sources, deposition was carried out under a vacuum of $5\times10^{-5}$ Torr without changing the ratio of the deposition rates so as to uniformly disperse Ag therein until the $GeS_{2.0}$ became 15 μg/cm² (film thickness: 500 Å) and the Ag became 3.0 μg/cm² thereby to form a sample containing about 8.4 atoms of Ag based on 100 atoms of $GeS_{2.0}$. 1-Phenyl-5-mercaptotetrazole put in an alumina coated tungsten basket was then deposited in an amount of 0.6 μg/cm² and Ag was then deposited in an amount of 10 μg/cm² to produce a sample. The deposited amounts are determined by a monitor (DTM-200 type monitor, produced by Sloan Co. U.S.A.) placed in the vacuum evaporation apparatus.

A positive type exposure mask was superposed on the deposition surface of this sample and the sample was exposed to light for 3 minutes using a PS-light, by which a distinct positive type image was formed.

A sample wherein Ag was not added to the $GeS_{2.0}$ deposition layer was produced in the same manner. When the sample was allowed to stand at 45° C. under a relative humidity of 75%, the light sensitivity was lost after 10 days. On the contrary, in the sample of the present invention produced in the present example, the light sensitivity was not lost and a practical and excellent image forming material was obtained.

EXAMPLES 9-30

After an aluminum plate of a size of 300 mm×400 mm which had been subjected to graining and anodic oxidation was placed in the form of an arc in a vacuum deposition apparatus at a distance of about 30 cm from the evaporation sources, $GeS_{2.5}$ and Ag were deposited uniformly by a simultaneous deposition process in the same manner as in Example 8 in amounts of 15 μg/cm² of $GeS_{2.5}$ and 4 μg/cm² of Ag to form a sample containing about 10.8 atoms based on 100 atoms of $GeS_{2.5}$.

Then, an organic compound a (as shown in Table 1 below) was deposited in an amount b (as shown in Table 1 below) and further silver was deposited in an amount of 6.0 μg/cm² to produce image forming materials of the present invention useful as lithographic printing materials. After they were exposed to light for t minutes (as shown in Table 1 below) using a PS-light, they were put on a "Hamadastar-600CD" lithographic printing machine. They were dampened with water and inked as generally done in lightographic printing, by which positive inked lithographic printing plates were obtained. When printing was carried out using these printing plates, 500 sheets of paper could be printed in all cases.

TABLE 1

| Example | Organic Compound (a) | Deposited Amount (b) (μg/cm²) | Exposure Time (t) (minute) |
|---|---|---|---|
| 9 | 1-(m-Caproamidophenyl)-5-mercapto-tetrazole 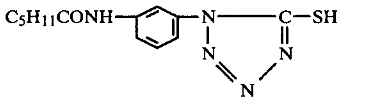 | 0.6 | 3 |
| 10 | 1-Phenyl-5-mercaptotetrazole 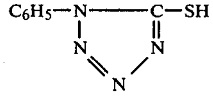 | 2.4 | 1.5 |
| 11 | 3-Methyl-4-phenyl-5-mercapto-1,2,4-triazole 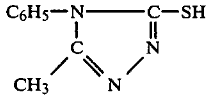 | 1.2 | 1.5 |
| 12 | 3,4-Dimethyl-5-mercapto-1,2,4-triazole 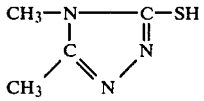 | 1.9 | 3 |
| 13 | 3-(p-Caproamidophenyl)4-ethyl-5-mercapto-1,2,4-triazole 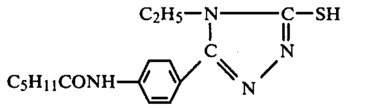 | 0.5 | 1.5 |
| 14 | 3-n-Undecyl-4-phenyl-5-mercapto | 0.3 | 3 |

TABLE 1-continued

| Example | Organic Compound (a) | Deposited Amount (b) (μg/cm²) | Exposure Time (t) (minute) |
|---|---|---|---|
| | 1,2,4-triazole 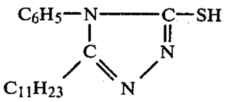 | | |
| 15 | 1,5-Dimercapto-3,7-diphenyl(1,2,4)triazolo(1,2-a)(1,2,4)triazole 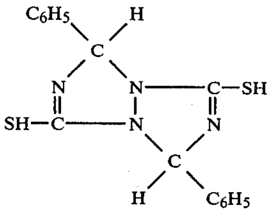 | 0.6 | 3 |
| 16 | 1-Phenyl-2-mercaptoimidazole 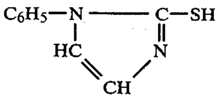 | 0.6 | 3 |
| 17 | 2-Hexadecylthioimidazoline Hydrobromide 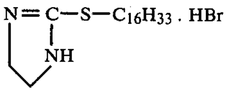 | 1.2 | 1.5 |
| 18 | 2-Thioxo-4-oxothiazolidine 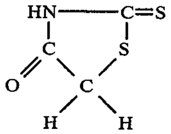 | 1.2 | 3 |
| 19 | 2,5-Dimercapto-1,3,4-thiadiazole 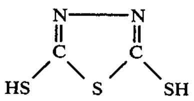 | 0.15 | 1.5 |
| 20 | Bismuthiol II 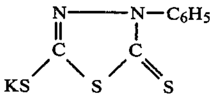 | 0.2 | 3 |
| 21 | 2-Ethylthio-4-methyl-6-hydroxypyrimidine 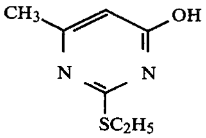 | 1.2 | 1.5 |
| 22 | 2-Mercapto-4-hydroxy-6-methyl pyrimidine 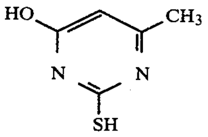 | 0.6 | 3 |
| 23 | N,N,N',N'-Tetramethyl-4,4'-di aminothiobenzophenone 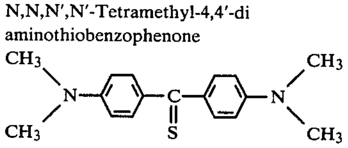 | 1.2 | 3 |
| 24 | Sodium Diethyldithiocarbamate | 0.5 | 3 |

TABLE 1-continued

| Example | Organic Compound (a) | Deposited Amount (b) ($\mu g/cm^2$) | Exposure Time (t) (minute) |
|---|---|---|---|
| | 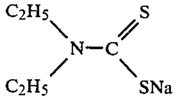 | | |
| 25 | Silver Diethyldithiocarbamate 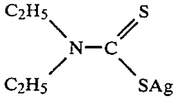 | 1.2 | 3 |
| 26 | N,N,N',N'-Tetramethyl-p-phenylenediamine Hydrochloride 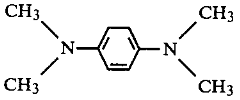 . 2HCl | 0.2 | 3 |
| 27 | Monoethylurea $C_2H_5NHCONH_2$ | 1.0 | 1 |
| 28 | Dimethylolthiourea $(HOCH_2NH)_2CS$ | 1.1 | 1 |
| 29 | 4-Phenylthiosemicarbazide 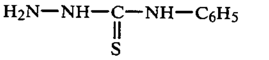 | 0.9 | 1 |
| 30 | 2,5-Di-(1,1-dimethylbutyl)hydroquinone 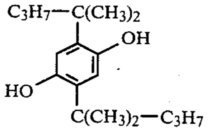 | 0.6 | 2 |

In cases of producing comparison examples in the same manner except that Ag was not added to the $GeS_{2.5}$ deposition layers, when they were allowed to stand at 45° C. under a relative humidity of 75% for 5 days after exposure to light, the contrast in each sample became very low and there was no difference between the hydrophilic property and the oleophilic property. Consequently, these samples could not be used as lithographic printing plates, because ink adhered to the total surface. On the contrary, in samples produced in accordance with the examples of the present invention, there was no deterioration of the contrast obtained by exposure and the difference between the hydrophilic property and the oleophilic property did not change. Consequently, they could be used as good positive type printing plates and stability was maintained for a long period of time. Accordingly, practically useful lithographic printing plates could be obtained.

EXAMPLE 31

After an aluminum plate of a size of 300 mm×400 mm which had been subjected to graining and anodic oxidation was placed in the form of an arc in a vacuum deposition apparatus at a distance of about 30 cm from the evaporation sources, $GeS_{2.5}$ and Ag were uniformly deposited by a simultaneous deposition process in the same manner as in Example 8 in amounts of 36 $\mu g/cm^2$ of $GeS_{2.5}$ and 8 $\mu g/cm^2$ of Ag to form a sample containing about 9.0 atoms of Ag based on 100 atoms of $GeS_{2.5}$. The resulting deposition film was then immersed in a solution of 0.06% by weight of 1-(m-caproamidophenyl)-5-mercaptotetrazole

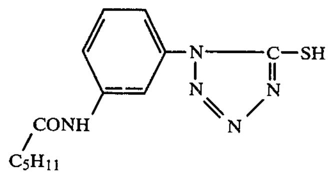

in ethanol for 15 seconds and dried at room temperature (at 22° C.). The sample was then immersed in an aqueous solution of 0.5% by weight of silver nitrate for 60 seconds and washed with water for 30 seconds. The sample was then immersed in ethanol for 3 seconds and dried at room temperature to produce a sample according to the present invention useful as a lithographic printing plate. A positive type exposure mask was superposed on this sample. When the sample was exposed to light for 2 minutes using a "Jet Printer-2000" (an exposure device produced by Ohku Seisakusho Co.), a distinct positive image was obtained. This was put on a Hamadastar 600CD lithographic printing machine without any processing being conducted and dampened with water. When an ink was applied thereto, a positive type inked lithographic plate was obtained. In using this printing plate, 15,000 sheets of paper could be printed.

A comparison sample was produced in the same manner except that Ag was not added to the $GeS_{2.5}$ deposition layer, and when the sample was allowed to stand at 45° C. under a relative humidity of 75% for 5 days after exposure to light, the contrast became very low and there was no difference between the hydrophilic property and the oleophilic property. Consequently, the sample could not be used as a lithographic printing plate, because the ink adhered to all of the surface.

The sample of the present invention produced in the present example did not change on storage under the same humidity and temperature conditions and the sample could be used as a good positive type lithographic printing plate. Further, printing durability was improved by addition of Ag.

While the invention has been described in detail and with reference to specific embodiments thereof, it will be apparent to one skilled in the art that various changes and modifications can be made therein without departing from the spirit and scope thereof.

What is claimed is:

1. In an image forming material comprising a support having thereon a layer composed of a Ge-S composition or a Ge-S-X composition, wherein X represents at least one element selected from the group consisting of Al, Si, Mg, Ti, V, Mn, Co, Ni, Sn, Zn, Pd, Se, Te, Fe, I, P and O, which undergoes a structural change capable of being detected optically, electrically or chemically upon exposure imagewise to light, wherein the improvement comprises:

said Ge-S or Ge-S-X composition layer is continuous and has a thickness of at least 300 Å, and said Ge-S composition or said Ge-S-X composition contains at least one element selected from the group consisting of Ag and Cu in an amount of more than two atoms of Ag and/or Cu based on 100 atoms of the Ge-S composition or the Ge-S-X composition, wherein the amount is sufficient to improve the moisture stability of the composition and the Ag and/or Cu is dispersed in the composition.

2. The image forming material as set forth in claim 1, wherein said material additionally contains an organic compound in a state of contacting said Ge-S composition or said Ge-S-X composition layer, said organic compound being a compound conventionally used in silver halide photographic chemistry as an antifogging agent, a sensitizing agent, a desensitizing agent, a developing agent, a dye, a pigment or a photochromic compound.

3. The image forming material as set forth in claim 2, wherein the amount of the Ag and/or Cu is 5 or more atoms based on 100 atoms of the Ge-S composition or the Ge-S-X composition.

4. The image forming material as set forth in claim 2, wherein the amount of the Ag and/or Cu in the Ge-S composition having the formula $GeS_\alpha$ is up to about $$\frac{\alpha - 1}{\alpha + 1} \times 200$$

and in the Ge-S-X composition having the formula $GeS_\alpha X_\beta$ is up to about $$\frac{\alpha - 1}{\alpha + \beta + 1} \times 200$$

wherein in the above $\alpha$ is the atomic ratio of sulfur atoms to germanium atoms and $\beta$ is the atomic ratio of X atoms to germanium atoms.

5. The image forming material as set forth in claim 4, wherein said Ag and/or Cu is present in an amount of about 80% of said amount as set forth in claim 4.

6. The image forming material as set forth in claim 5, wherein the amount of Ag is up to 10 atoms and the amount of Cu is up to 10 atoms, each based on 100 atoms of the Ge-S composition or the Ge-S-X composition.

7. The image forming material as set forth in claim 2, wherein the atomic ratio of the Ge to the S on the Ge-S composition or the Ge-S-X composition is $1 \leq S/Ge < 16$.

8. The image forming material as set forth in claim 2, wherein X is an element selected from the group consisting of Al, Si, I, P and O.

9. The image forming material as set forth in claim 2, wherein said organic compound is a compound having at least one of a —SH moiety, a C=S moiety, a $-(S)_n-$ moiety where n is 1 to 6, a $-SO_2H$ moiety or a $-SO_3H$ moiety.

10. The image forming material as set forth in claim 2, wherein said organic compound is selected from the group consisting of Methylene Blue, Crystal Violet and Rhodamine B.

11. The image forming material as set forth in claim 9, wherein said organic compound is selected from the group consisting of (1) thioureas represented by the following formula:

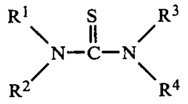

wherein $R^1$, $R^2$, $R^3$ and $R^4$ each represents a hydrogen atom, an alkyl group having 1 to 5 carbon atoms, a hydroxyalkyl group having 1 to 5 carbon atoms or a phenyl group, or wherein $R^1$ and $R^2$ or $R^3$ and $R^4$ may be bonded to form a 5-membered heterocyclic ring;

(2) thiosemicarbazides and thiocarbazides represented by the following formulae:

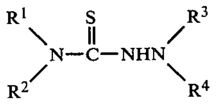

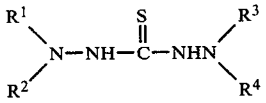

wherein $R^1$, $R^2$, $R^3$ and $R^4$ each represents a hydrogen atom, an alkyl group having 1 to 5 carbon atoms, or a phenyl group, or derivatives thereof;

(3) dithiocarbamic acids represented by the following formula:

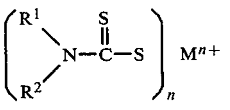

wherein $R^1$ and $R^2$ each represents a hydrogen atom, an alkyl group having 1 to 5 carbon atoms, an aralkyl group having 7 to 9 carbon atoms or a phenyl group; M represents a hydrogen atom or a n-valent metal ion; and n represents 1 or 2;

(4) thiobenzophenones represented by the following formula:

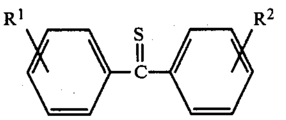

wherein $R^1$ and $R^2$ each represents a hydrogen atom, an alkyl group having 1 to 5 carbon atoms; an alkoxy group having 1 to 5 carbon atoms, a dialkylamino group having 1 to 5 carbon atoms in each of the alkyl moieties thereof, a chlorine atom, a bromine atom or an iodine atom;

(5) dithiolan;
(6) a thiazole or a benzothiazole;
(7) a thiadiazole;
(8) a pyrrole or a benzopyrrole;
(9) an imidazole or a benzimidazole;
(10) an imidazoline;
(11) a triazole or a benzotriazole;
(12) a tetrazole;
(13) a pyrimidine; and
(14) a tetrazaindene.

12. The image forming material as set forth in claim 2, wherein said organic compound is selected from the group consisting of 1-phenyl-5-mercaptotetrazole, 3-methyl-4-phenyl-5-mercapto-1,2,4-triazole, 3,4-dimethyl-5-mercapto-1,2,4-triazole, 3-(p-caproamidophenyl)4-ethyl-5-mercapto-1,2,4-triazole, 3-n-undecyl-4-phenyl-5-mercapto-1,2,4-triazole, 1,5-dimercapto-3,7-diphenyl(1,2,4)triazolo(1,2,2) (1,2,4)triazole, 1-phenyl-2-mercaptoimidazole, 2-hexadecylthioimidazoline hydrobromide, 2-thioxo-4-oxothiazolidine, 2,5-dimercapto-1,3,4-thiadiazole, bismuthiol II, 2-ethylthio-4-methyl-6-hydroxypyrimidine, 2-mercapto-4-hydroxy-6-methyl pyrimidine, N,N,N',N'-tetramethyl-4,4'-diaminothiobenzophenone, sodium diethyldithiocarbamate, silver diethyldithiocarbamate, N,N,N',N'-tetramethyl-p-phenylene-diamine hydrochloride, monoethylurea, dimethylolthiourea, 4-phenylthiosemicarbazide, 2,5-di-(1,1-dimethylbutyl)hydroquinone and 1-(m-caproamidophenyl)-5-mercaptotetrazole.

13. The image forming material as set forth in claim 1, wherein said improvement comprises said Ge-S composition or said Ge-S-X composition containing Ag in an amount of more than two atoms of Ag based on 100 atoms of the Ge-S composition or the Ge-S-X composition.

14. The image forming material as set forth in claim 1, wherein said improvement comprises said Ge-S composition or said Ge-S-X composition containing Cu in an amount of more than two atoms of Cu based on 100 atoms of said Ge-S or said Ge-S-X composition.

15. A method for forming visible images having different hydrophilicity or hydrophobicity in the exposed areas than in the non-exposed areas which comprises exposing the image-forming material of claim 1 to light.

16. The method set forth in claim 15, wherein said image forming material additionally contains an organic compound conventionally used in silver photographic chemistry as an antifogging agent, a sensitizing agent, a desensitizing agent, a developing agent, a dye, a pigment, or a photochromic compound in a state of contacting said Ge-S composition or said Ge-S-X composition layer.

17. The method as set forth in claim 15, where in addition to exposing said material to light, said material is physically developed to thereby produce visible images having a high contrast.

18. The image forming material as set forth in claim 1, wherein said layer composed of a Ge-S composition or a Ge-S-X composition is provided by simultaneous deposition of Ag and/or Cu and the Ge-S or Ge-S-X composition onto the support.

19. The image forming material as set forth in claim 18, wherein said layer is provided by a vacuum deposition process, a flash evaporation process, an electron beam deposition process, a sputtering process, an ion plating process, an electrodeposition process, an electrophoresis process, a gas phase deposition process or a spraying process.

20. The image forming material as set forth in claim 18, wherein said layer is provided by a vacuum deposition process.

21. The image forming material as set forth in claim 18, wherein said layer is provided by an electron beam deposition process.

22. A method for producing an image forming material, which comprises simultaneously depositing (i) at least one element selected from the group consisting of Ag and Cu, and (ii) a Ge-S composition or a Ge-S-X composition, on a support to form a layer, wherein X represents at least one element selected from the group consisting of Al, Si, Mg, Ti, V, Mn, Co, Ni, Sn, Zn, Pd, Se, Te, Fe, I, P and O, wherein said composition undergoes a structural change capable of being detected optically, electrically or chemically upon imagewise exposure to light, said Ge-S or Ge-S-X composition layer is continuous and has a thickness of at least 300 Å, and said layer contains Ag and/or Cu dispersed therein in an amount of more than two atoms based on 100 atoms of the Ge-S or Ge-S-X composition.

23. The method for producing an image forming material as set forth in claim 22, wherein said layer is formed by a vacuum deposition process, a flash evaporation process, an electron beam deposition process, a sputtering process, an ion plating process, an electrodeposition process, an electrophoresis process, a gas phase deoposition process or a spraying process.

24. The method for producing an image forming material as set forth in claim 22, wherein said layer is formed by a vacuum deposition process.

25. The method for producing an image forming material as set forth in claim 22, wherein said layer is formed by an electron beam deposition process.

26. The method for producing an image-forming material as set forth in claim 22, wherein said material additionally contains an organic compound in a state of contacting said Ge-S composition or said Ge-S-X composition layer, said organic compound being a compound conventionally used in silver halide photographic chemistry as an antifogging agent, a sensitizing agent, a desentizing agent, a developing agent, a dye, a pigment or a photochromic compound.

27. The method for producing an image-forming material as set forth in claim 22, wherein the amount of the Ag and/or Cu is 5 or more atoms based on 100 atoms of the Ge-S composition or the Ge-S-X composition.

28. The method for producing an image forming material as set forth in claim 22, wherein the amount of the Ag and/or Cu in the Ge-S composition having the formula $GeS_\alpha$ *is up to about*

$$\frac{\alpha - 1}{\alpha + 1} \times 200$$

and in the Ge-S-X composition having the formula $GeS_{\alpha}X_{\beta}$ is up to about $$\frac{\alpha - 1}{\alpha + \beta + 1} \times 200,$$

wherein in the above $\alpha$ is the atomic ratio of sulfur atoms to germanium atoms and $\beta$ is the atomic ratio of X atoms to germanium atoms.

* * * * *